United States Patent
Warmack et al.

(10) Patent No.: US 10,634,732 B2
(45) Date of Patent: Apr. 28, 2020

(54) ELECTRICAL METER PROBE CONTACT VERIFICATION SYSTEM

(71) Applicant: UT Battelle, LLC, Oak Ridge, TN (US)

(72) Inventors: Robert J. Warmack, Oak Ridge, TN (US); Milton Nance Ericson, Oak Ridge, TN (US); Roger A. Kisner, Oak Ridge, TN (US); Yarom Polsky, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 321 days.

(21) Appl. No.: 15/675,456

(22) Filed: Aug. 11, 2017

(65) Prior Publication Data

US 2019/0049509 A1     Feb. 14, 2019

(51) Int. Cl.
*G01R 31/50* (2020.01)
*G01R 1/067* (2006.01)
*G01R 1/073* (2006.01)

(52) U.S. Cl.
CPC ......... *G01R 31/50* (2020.01); *G01R 1/06722* (2013.01); *G01R 1/073* (2013.01)

(58) Field of Classification Search
CPC .. G01R 31/026; G01R 1/06722; G01R 1/073; G01R 31/50; G01R 31/3277; G01R 33/26; G01R 31/382
USPC ............. 324/754.01–754.21, 755.01, 755.11, 324/756.03, 690, 696, 500, 538, 724, 324/72.5, 149
See application file for complete search history.

(56) References Cited

U.S. PATENT DOCUMENTS 7,019,544 B1 * 3/2006 Jacobs ............... G01R 1/06772
                                                    324/715
7,768,292 B1 * 8/2010 Koch ..................... G01R 31/40
                                                    324/764.01

* cited by examiner

*Primary Examiner* — Melissa J Koval
*Assistant Examiner* — Trung Nguyen
(74) *Attorney, Agent, or Firm* — Benesch, Friedlander, Coplan & Aronoff LLP

(57) ABSTRACT

A system and method verifies continuity with and measures voltage across a circuit under test (in some instances simultaneously) using two or more test probes. Two or more probe continuity circuits measure continuity through the test probes by injecting a test current through and measuring a processed test current received at each of the plurality of test probes. The probe continuity circuits measure the respective processed test current rendered by the test current flowing through the test circuit at each test probe. A voltmeter measures the potential difference across the test probes.

16 Claims, 13 Drawing Sheets

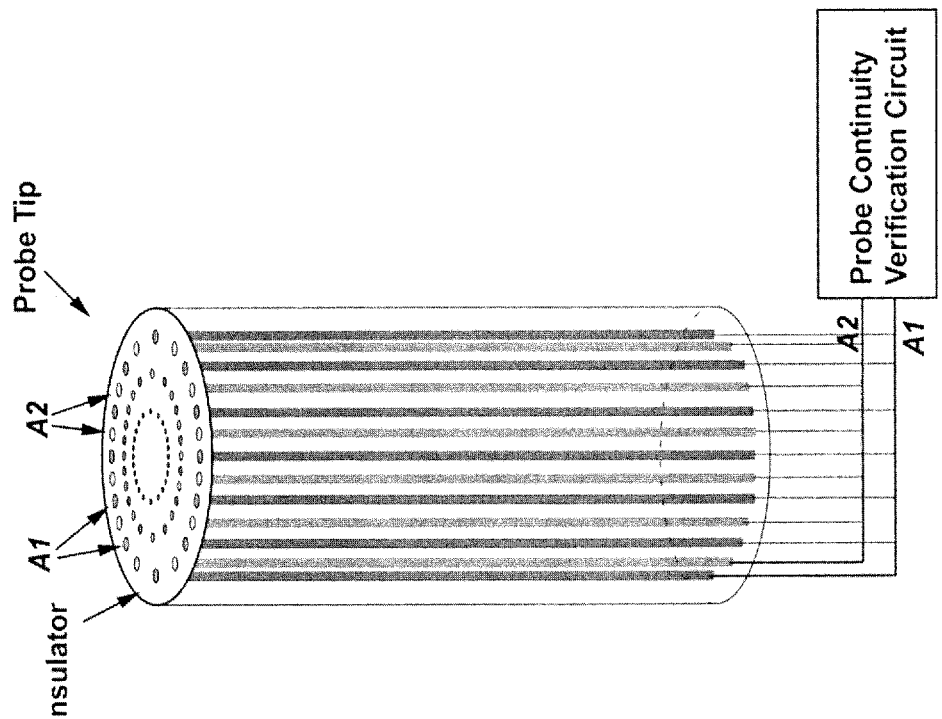
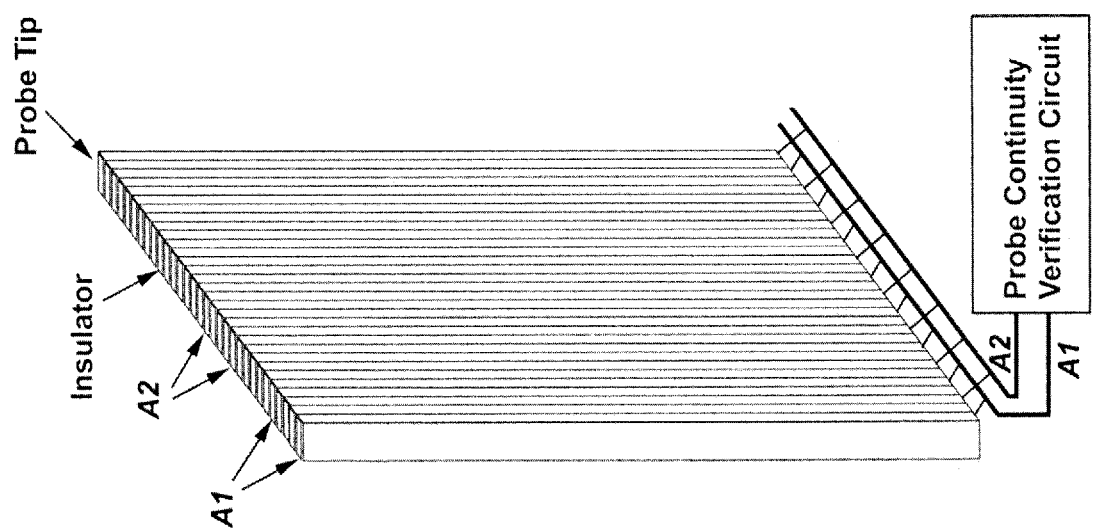
FIGURE 10

ELECTRICAL METER PROBE CONTACT VERIFICATION SYSTEM

STATEMENT REGARDING FEDERALLY SPONSORED RESEARCH AND DEVELOPMENT

This invention was made with United States government support under Contract No. DE-AC05-00OR22725 awarded by the United States Department of Energy. The United States government has certain rights in the invention.

BACKGROUND

1. Technical Field

This disclosure relates to electrical safety and more specifically to systems and processes that assure continuity between a measurement instrument and an electrical circuit.

2. Related Art

Electric current and voltages can cause shock and trauma. Current and voltages are especially dangerous when victims come into contact with them. High currents and voltages can cause victims to lose control of their muscles. This may cause an unwillingly first clench of a high voltage wire, a fibrillating heart, rapid, uncoordinated movements, or cause respiratory paralysis. These harmful effects do not always stop when the current or voltage sources are turned off. Tingling sensations, sustained muscular contractions, and ventricular fibrillation sometimes continue even after the voltage and/or current are removed.

BRIEF DESCRIPTION OF THE DRAWINGS

FIG. 10 is a side view of a linear and radial multi-conductor dual-contact probe.

DETAILED DESCRIPTION OF THE PREFERRED EMBODIMENTS

Insulation, small contact areas, oxidation, defective and/or worn probes, random variations, and human error are just a few conditions that adversely affect electrical measurements. These conditions cause misleading readings when a voltmeter is not properly connected to a conductor or circuit. Voltmeters typically indicate zero voltage if connected to a deenergized circuit and indicate zero voltage when disconnected to a circuit, whether energized or not. In a worst-case scenario, a false-reading due to a poor connection may indicate that a circuit is deenergized, when the circuit is actually energized. Physical contact between measurement probes and circuit elements do not necessarily correspond to electrical contact due to insulative coatings or to other deficiencies in the measurement. While repetitive readings may compensate for some errors, others are not easily detected. These errors are elusive because they are sometimes caused by bad habits, worn equipment, insulative coatings or external conditions. In some instances, errors are missed. Neither calibrations, algorithms, nor equipment replacement solves these problems, which can be dangerous or fatal when working with high voltages and currents.

Figure 1:
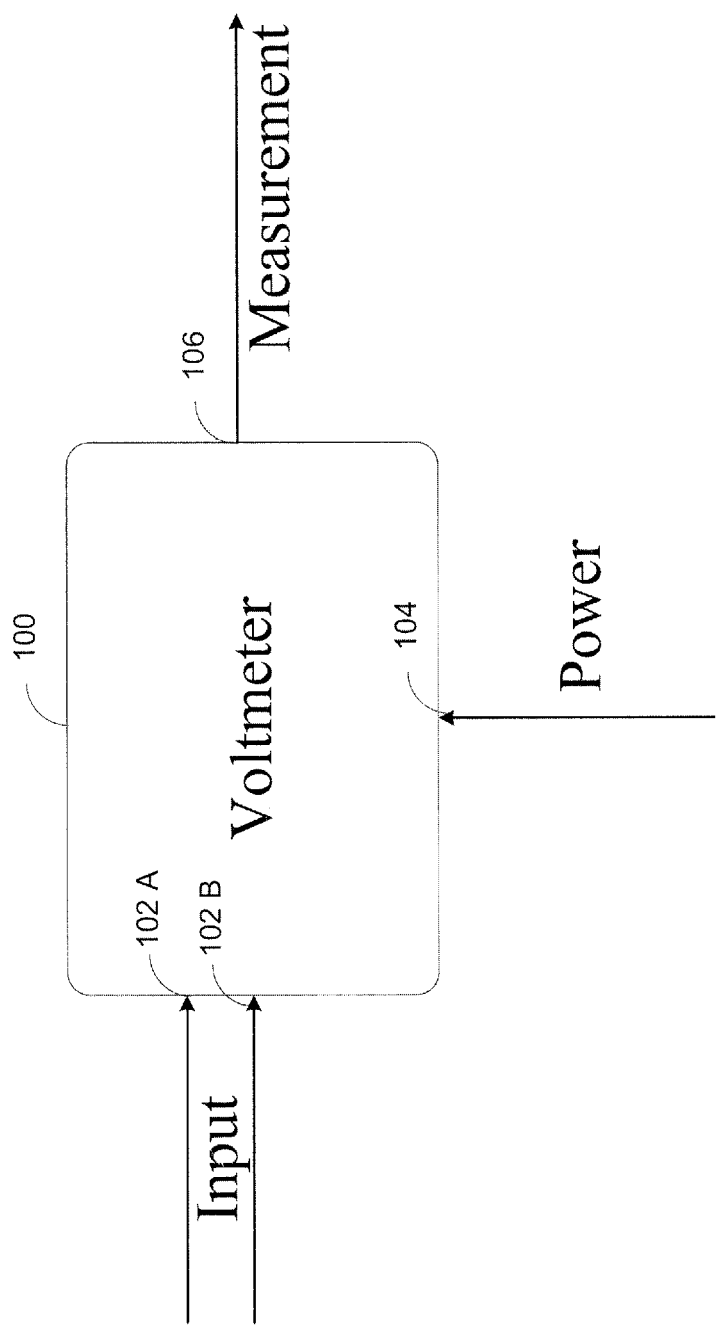
FIG. 1 is a block diagram of a voltmeter.

A voltmeter measures potential difference by extracting current from an AC or DC circuit. As shown in FIG. 1, a four-port device represents a voltmeter 100. The signal input ports 102A and 102B have a high impedance so that the conductor or circuit under test sees a small load. In other words, the voltmeter draws energy, although a minimal amount, from the conductor or circuit under test. The power port 104 is an input port that receives electrical power. The power drives the display and the internal circuits that measure the voltage. The output port 106 provides voltage measurements in either a digital or an analog form. While the difference between analog and digital voltmeters is largely due to the way in which the input signals are processed, both analog and digital meters draw current when measuring voltage.

For analog and/or digital meters ("voltmeter") 100 to be accurate, the probes that deliver the signals to input ports 102A and 102B must make electrical contact with the conductor or circuit under test (collectively referred to as a load or circuit under test in this description). A single point probe is a common type of probe used for this purpose. While single point probes are versatile, the size and/or roundness of their tips sometimes prevent access to conductors or circuits under test. When the tips are sharpened to improve access, the base metals that forms these probes and the conductors of the circuit under test tend to tarnish compromising the connection. Sharp tip single point probes are also versatile and can reach small places. Sharp tip single point probes are less likely to slip when the probes make contact with the surface of a circuit. Unfortunately, these probes are often made of stainless steel (a poor electrical conductor), are easily damaged, and make contact with only a small area of the circuit. A hook and pincer single point probe and IC test single point clips also make contact with small areas, and like the probes above, sometimes provide faulty readings caused by discontinuous contact or corroded connections that can be difficult to detect. In any case, any electrical connection between the probes and the circuit elements is required for an accurate electrical measurement.

Figure 2:
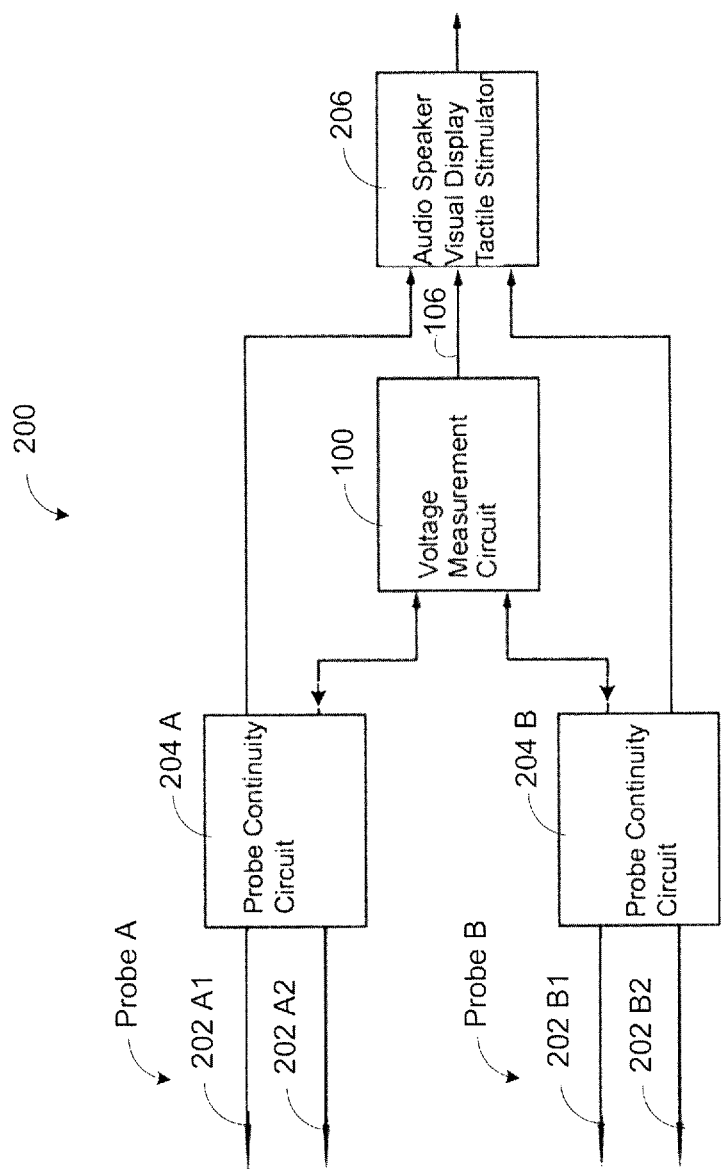
FIG. 2 is a block diagram of a voltmeter coupled to probe continuity circuits, an audio speaker, a visual display, and/or a tactile stimulator

FIG. 2 is a block diagram of a voltmeter with probe continuity verification. The first blocks of FIG. 2 comprise a pair of probe continuity circuits associated with node A and node B. Dual-contact probe A and continuity circuit 204A determine when a conductor or circuit under test provides a closed path, indicative of electrical contact with a circuit element (not shown), for current flow. The closed path includes the separation between node 202A1 and node 202A2. A dual-contact probe (also referred to as a test probe or a dual-contact split probe) allows for simultaneous measurement of continuity through usually two or more like electrically isolated complimentary members of a single probe. Continuity is measured through the multiple (e.g., two or more) electrically isolated complimentary members that are also referred to as complimentary elements.

Probe continuity circuit 204B determines whether the circuit under test provides a closed path for current flow between a second pair of contact elements associated with dual-contact probe B or dual-contact split probe B (a first element or elements of probe B making contact with node 202B1 and a second (separate) element or elements of probe B insulated from the first element(s) making contact with node 202B2). Even when the circuit is active or powered up, probe continuity circuits 204A and 204B can confirm continuity to each of two circuit elements (not shown).

In FIG. 2, for example, probe continuity circuit 204A injects a programmable test current through node 202A1. The probe continuity circuit 204A measures the current flowing through node 202A2. Applying Ohm's law, resistance is measured. When the resistance between nodes 202A1 and 202A2 is below a predetermined value (e.g., <100Ω or sufficiently below the impedance of the voltage measurement circuit 100), continuity is established and the probe continuity circuit 204A transmits a tactile, aural, and/or visual continuity confirmation alert or alarm that is rendered through an audio speaker, a visual display, and/or a tactile stimulator 206. Similarly, when the resistance between nodes 202A1 and 202A2 is equal to or greater than a predetermined value (e.g., =/>100Ω or not sufficiently below the impedance of the voltage measurement circuit 100), the probe continuity circuit 204A transmits a different tactile, aural, and/or visual open circuit alert or alarm different from the continuity confirmation alert or alarm, or in the alternative, transmits no alert. A continuity confirmation alert (or alarm) may take a similar or different sensory form than the open circuit alert (or alarm).

Probe continuity circuit 204B operates in a similar fashion by injecting a programmable test current through node 202B1. The probe continuity circuit 204B measures the current flowing through node 202B2. Applying Ohm's law, resistance is measured. When the resistance between nodes 202B1 and 202B2 is below a predetermined value (e.g., <100Ω or sufficiently below the impedance of the voltage measurement circuit 100), continuity is confirmed and the probe continuity circuit 204B transmits a tactile, aural, and/or visual continuity confirmation alert or alarm that is rendered through the audio speaker, the visual display, and/or the tactile stimulator 206. Similarly, when the resistance between nodes 202B1 and 202B2 is equal to or greater than a predetermined value (e.g., = or >100Ω or not sufficiently below the impedance of the voltage measurement circuit 100), the probe continuity circuit 204B transmits a different tactile, aural, and/or visual open circuit alert or alarm different from the continuity confirmation alert or alarm, or in the alternative, transmit no alert. Like probe A, the continuity confirmation alert (or alarm) for probe B may take a similar or different sensory form than its open circuit alert (or alarm).

With electrical connections at each of the probes and the conductor or circuit under test are verified, the potential difference between probes A and B is accurately measured by voltmeter 100. When the output is presented in an audible and/or visual format, an audio speaker (via a speech synthesizer) and/or a digital display may render the reading.

Figure 3:
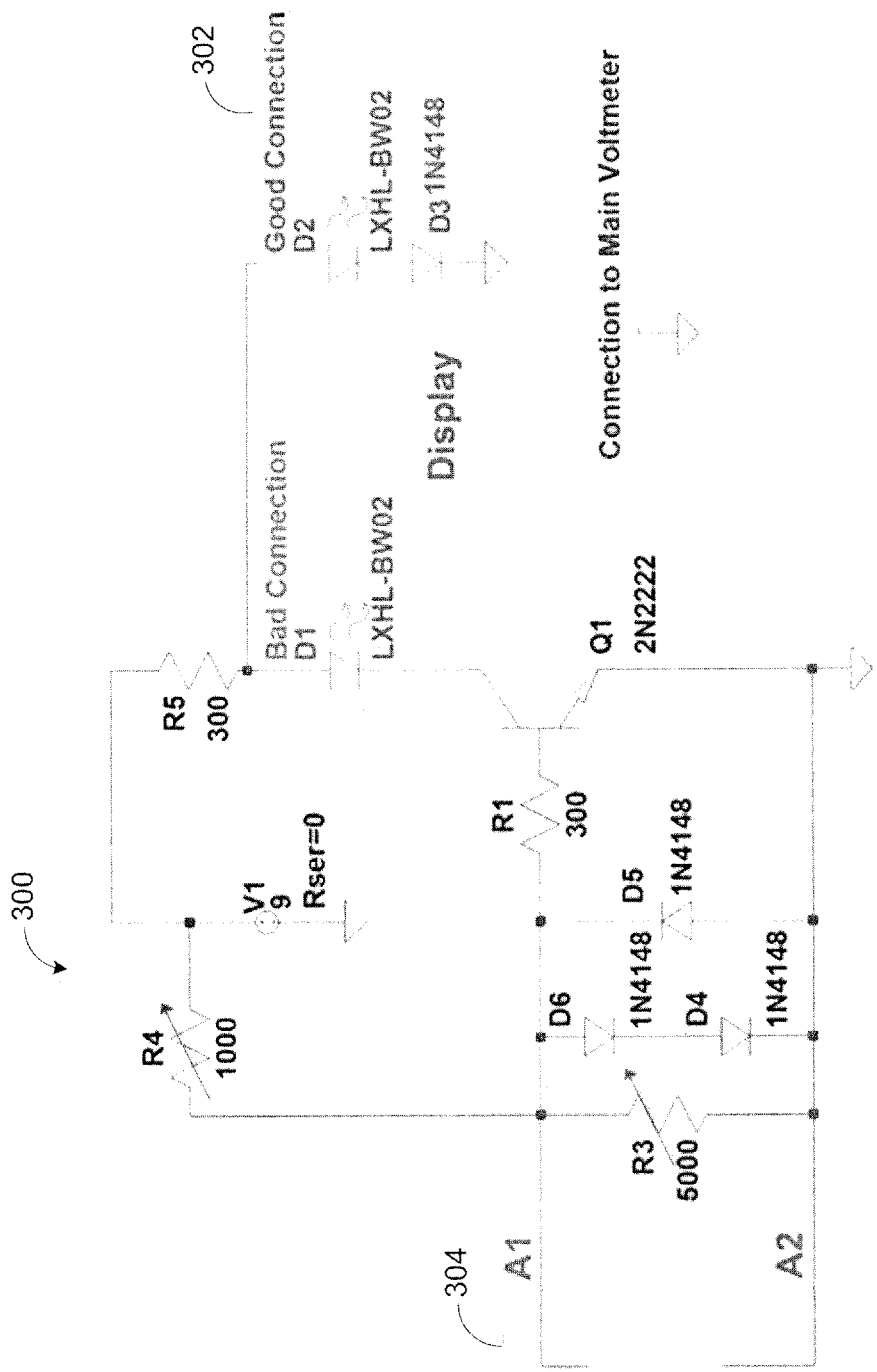
FIG. 3 is a probe continuity circuit coupled to a conductor or a circuit under test and a display.

FIG. 3 is a probe continuity circuit 300 used with one or more signal inputs of a voltmeter. The probe continuity circuit 300 couples a display 302 and a conductor or circuit under test 304. V1, variable R4, and variable R3 comprise a programmable current source. The programmable current source injects a programmable test current into node A1. When the resistance across A1 and A2 of dual-contact probe A is below a predetermined value (e.g., <100Ω) Q1 (e.g., the switch) responds by turning off. Q1's collector to base current ($i_{cb}$) ceases to conduct, forward biasing D2 and D3, which converts the applied voltage to a signal (e.g., converted to light via D2) indicating a good connection between the circuit under test and probe A. When the resistance between A1 and A2 of dual-contact probe A equals or exceeds a predetermined value (e.g., =/>100Ω), programmable resistors R3 and R4 and source V1 cause Q1's base to emitter voltage ($V_{be}$) to exceed seven tenths of a volt, which turns Q1 on. With Q1 on, D1 is forward biased, which converts the voltage sourced by V1 to a signal identifying a poor circuit connection between the circuit under test and probe A. The connection conditions may be associated with multiple colors that identify a connection status. For example, D1 and D2 may comprise multi-colored LEDs, where each color or group of colors represent a connection's condition. Various shades of green light generated by D1, for example, may indicate a strong electrical connection between the circuit under test and probe A with a stronger shade indicating stronger connections. Shades of solid yellow light generated by D1 may indicate a weak electrical connection between the circuit under test and probe A with stronger shades indicating a stronger connection; and when no light or a blinking white light is generated by D1, the probe continuity circuit 300 may identify an open circuit or a very high resistant connection between the circuit under test and probe A. Similarly, the multi-colors generated by D2 may identify the level of resistance measured between the circuit under test and probe A.

Figure 4:
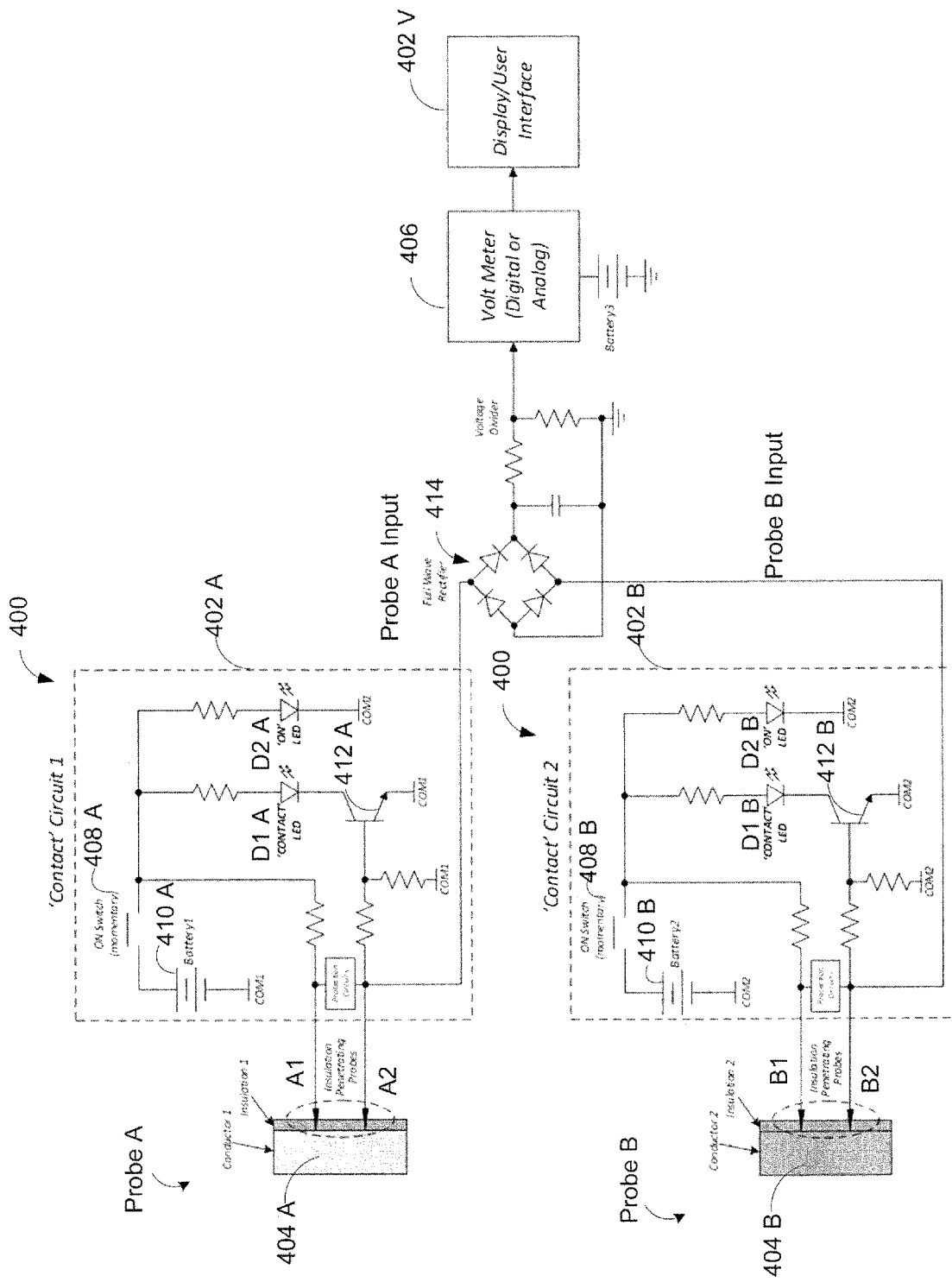
FIG. 4 is an alternate probe continuity circuit coupled to a conductor or a circuit under test and a display and a voltmeter.

FIG. 4 shows alternative probe continuity circuits that may be used with two or more dual-contact probes (two probes are shown: probe A and probe B). The probe continuity circuits 400 are coupled to multiple displays 402A, 402B, and 402V, a circuit under test 404A and 404B, and a voltmeter 406.

When power is applied via a portable power source 410A via a momentary switch 408A, the portable power source 410A injects a test current through current limiting resistors coupled to node A1. Also, D2A is forward biased to indicate that the power source 410A is active. In some probes, the portable power source includes a switch-mode boost converter and/or regulator that steps up and regulates the current delivered to the circuit under test. When the resistance across A1 and A2 is below a predetermined value (e.g., <100Ω) switch 412A responds by turning on. Switch 412A's activation forward biases D1A, which converts the applied voltage to light indicating a good circuit connection (e.g., <100Ω) between circuit 404A and probe A. When the resistance between A1 and A2 equals or exceeds a predetermined value (e.g., =/>100Ω), the portable power source 408A turns switch 412A off.

Because both probe continuity circuits 400 shown in FIG. 4 are identical, dual-contact probe B operates similarly. This means that when power is applied via a portable power source 410B through momentary switch 408B, the portable power source 410B injects a test current through current limiting resistors coupled to node B1. Here, D2B is forward biased to indicate that the power source 410B is active. Like probe A, the portable power source of the continuity circuit 400 coupled to probe B may include a switch-mode boost converter and/or regulator in some systems that steps up and regulates the current delivered to the circuit under test. When the resistance across B1 and B2 is below a predetermined value (e.g., <100Ω) switch 412B responds by turning on. Switch 412B's activation forward biases D1B, which converts the applied voltage to light indicating a good circuit connection (e.g., <100Ω) between circuit 404B and probe B. When the resistance between B1 and B2 equals or exceeds a predetermined value (e.g., =/>100 S2), the portable power source 408B turns switch 412B off.

In FIG. 4, the voltages sensed by the probes are optionally connected to a diode bridge 414 to convert alternating-current-voltage or bipolar-direct-current-voltage differences to a unipolar voltage that is then processed by voltmeter 406, and a measurement is rendered via a display or a light bar. When good connections between the circuits 404A and 404B and dual-contact probe A and dual-contact probe B, respectively, are indicated by both lights DA1 and D1B, an valid voltage reading by voltmeter 406 is assured. Voltmeter 406 can measure the applied voltage between probes A and B multiple ways including transducing the potential difference into a mechanical torque (e.g., electromechanical meter) or by sampling and converting the analog input signals into a discrete time series (e.g., digital voltmeters). When continuity is under test, voltage may still be measured in alternate systems. In these systems, the voltmeter 406 accounts for the current injections ($I_c$) by subtracting the injected current $I_c$ from the current drawn from the circuit ($I_v$) as expressed by:

$$I_v = \frac{U_v}{Z_v} - \frac{U_c}{Z_c}$$

where $U_v$ is the voltage measured between probes A and B (across the load or circuit under test); $Z_v$ is the resistive impedance between probes A and B; $U_c$ is the voltage applied to the circuits 404 A and 404 B through the probe continuity circuit, and $Z_c$ is the resistive impedance of the continuity circuits 404 A and 404 B. With current and impedance known, Ohm's law derives voltage.

Figure 5:
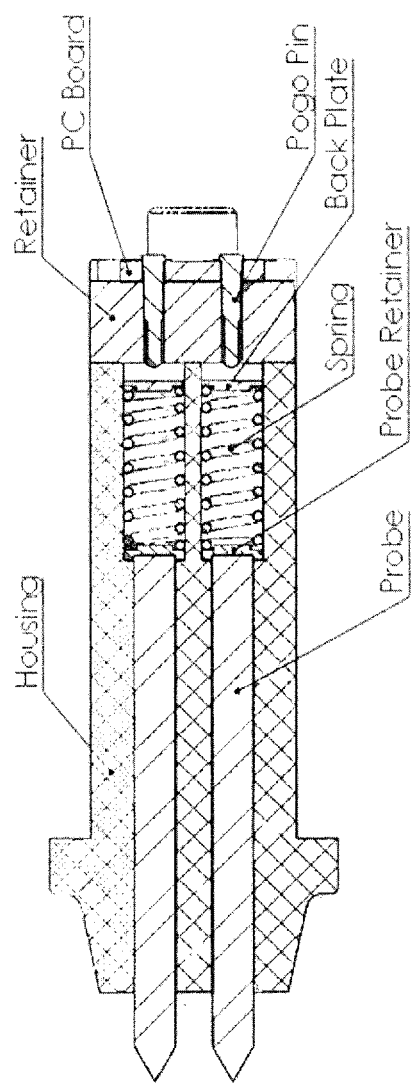
FIG. 5 is a cross-sectional view of a dual-contact probe.
Figure 6:
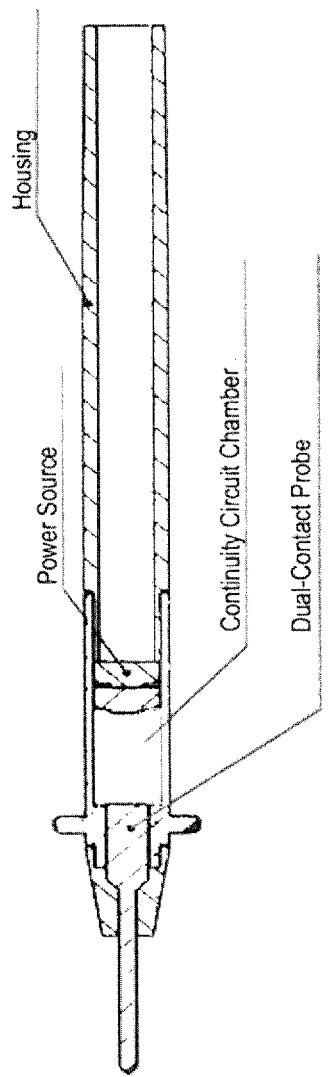
FIG. 6 is a cross-sectional view of an alternate dual-contact probe.

Since the dual-contact probes described above may replace single contact probe devices, and may be retrofitted to existing voltmeters that do not measure continuity and voltage together or simultaneously, the dual-contact elements of the probes may be situated adjacent and partially electrically isolated from one another enclosed within an insulated housing. FIG. 5 shows an exemplary dual-contact probe assembly terminating at a tubular end. An insulated housing insulates the spear-shaped elements and independent helical springs from each other and the external environment. The helical springs bias the spear-shaped elements to the contact surfaces. A retainer assembly enables contact between the spear-shaped elements and a printed circuit, which connects the spear-shaped elements to the probe continuity circuit. The probe continuity circuit may be located adjacent to or behind the printed circuit enclosed within a chamber formed within a housing as shown in FIG. 6. In FIGS. 5 and 6, probe continuity circuit is positioned behind the dual-contact probe insulated from the grip. The grip is contoured about the outer housing.

Figure 7:
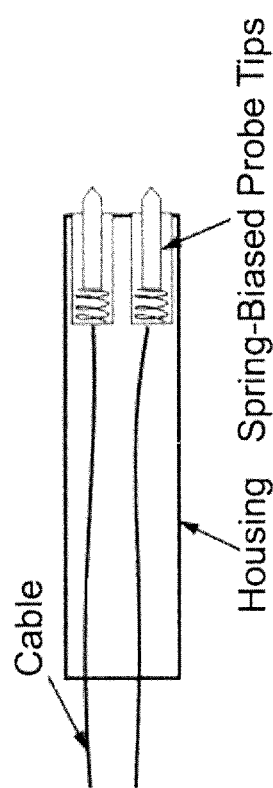
FIG. 7 is a cross-sectional view of a second alternate dual-contact probe.
Figure 8:
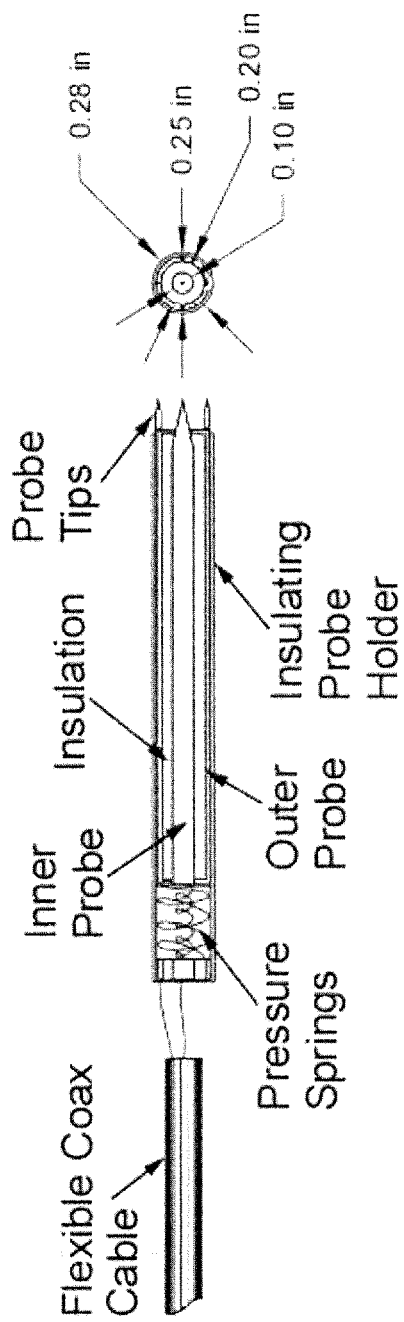
FIG. 8 is a cross-sectional view of a third alternate dual-contact probe.

Side-by-side spear-shaped pointed dual-contact elements shown in FIG. 7 are biased by independent serpentine springs. Cables connect the elements to the probe continuity circuits and the voltmeter. In FIG. 8, concentric coaxial members biased by separate concentric coaxial serpentine springs are used. The inner and outer concentric coaxial members are annularly insulated from one another and biased to contact small circuit areas. While the separate coaxial serpentine springs are not electrically insulated from one another in FIG. 8 (a flexible coax radial cable passes radially through them), in alternative probes, the springs are electrically insulated and serve as an electrical conductor between the probes and probe continuity circuits and/or voltmeter.

Figure 9:
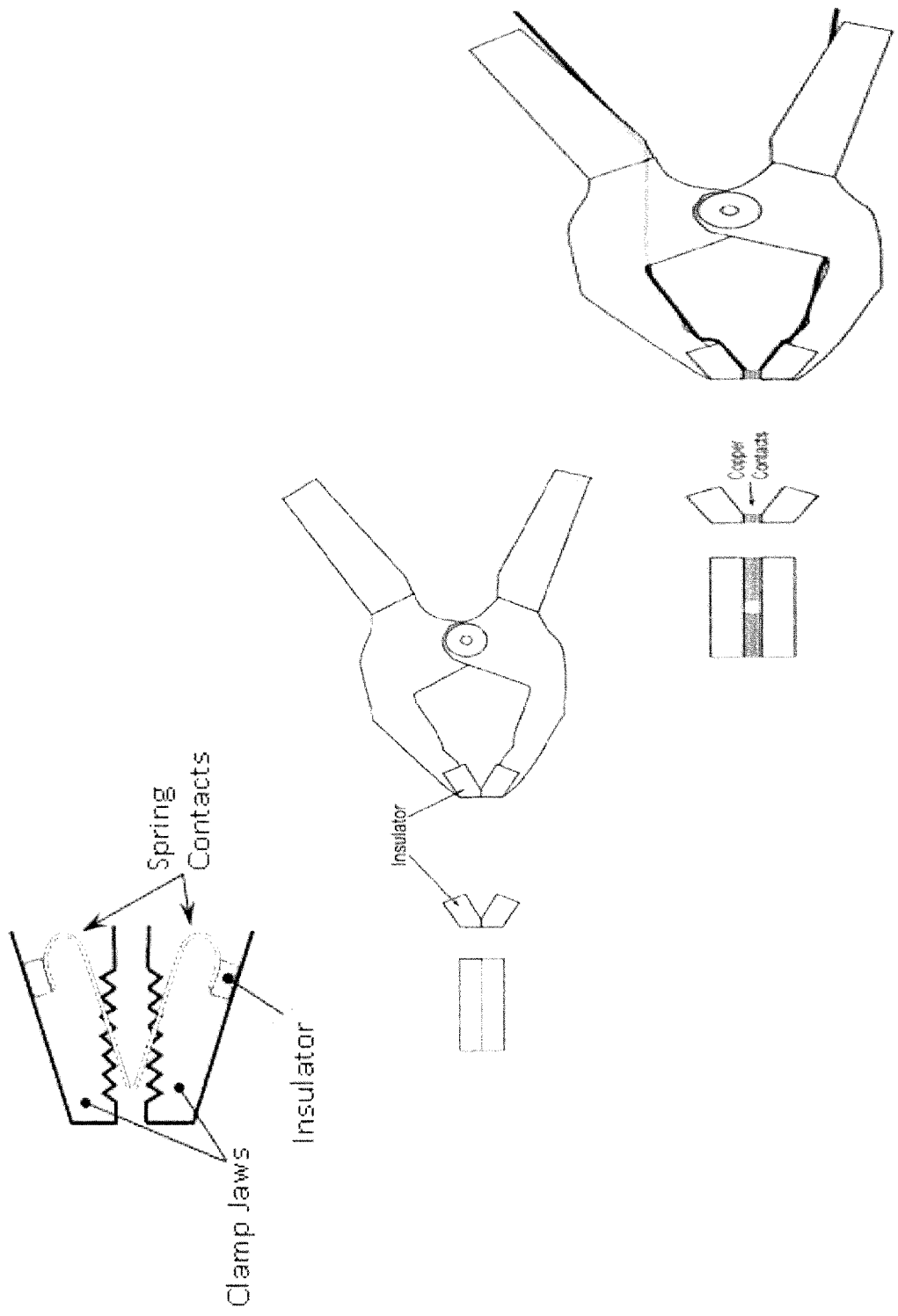
FIG. 9 is a cross-sectional view of a multiple clamp jaw dual-contact probes.

Contact with the circuit under test may also be made by a clamp jaw style probe. In FIG. 9, a handle actuates the jaws apart of the clamp jaw and the hook-like springs biases them together through a range of jaw positions. The jaw positions are adjustable to the circuits under test. Insulated contact members connect the circuit under test to the the probe, continuity circuit, and voltmeter.

Figure 11:
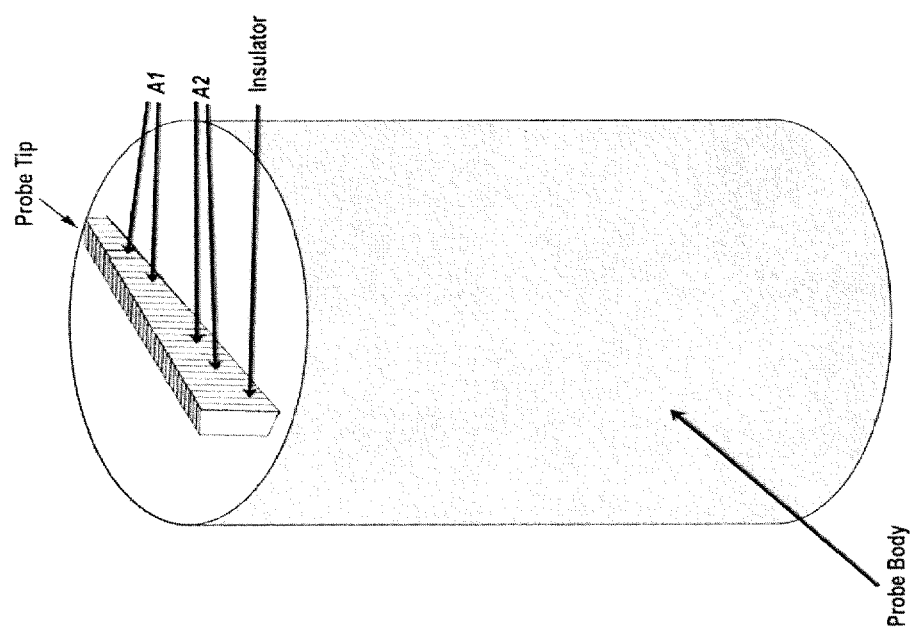
FIG. 11 is a side view of a linear multi-conductor disposed on an external surface of a dual-contact probe.
Figure 12:
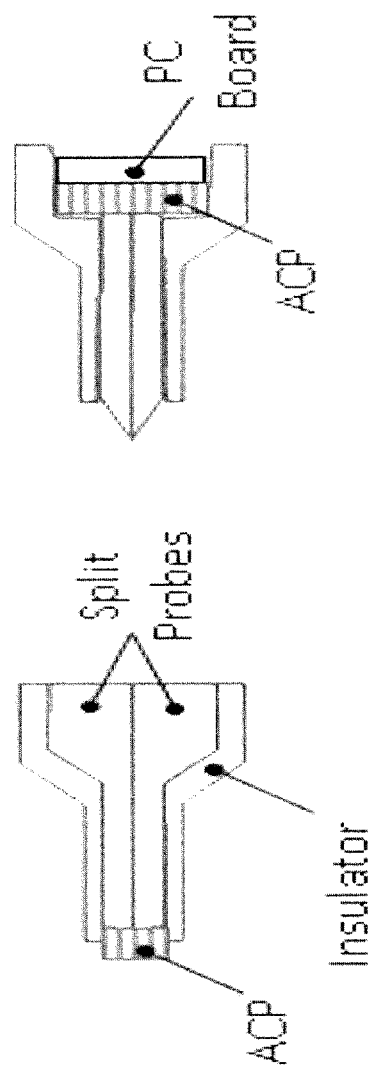
FIG. 12 is a dual-contact split probe with an anisotropic conducting polymer disposed on an external contacting surface and a dual-contact split probe with an anisotropic conducting polymer linear disposed within the probe's housing.

The contact members described above may include an anisotropic conducting polymer (ACP) linearly or radially spaced apart and separated by elastomer insulating members. The ACP electrically conducts in a linear direction as shown in FIGS. 10 and 11. In FIGS. 10 and 11, the elastomer insulator members prevent conduction between the multi split-probe members by separating and electrically isolating the conducting area. The soft, resilient ACP used in FIGS. 10 and 11 make contact with the circuit under test and couple the probe continuity circuits through graphitic or metallic conductors. The ACP may cover a portion of the probe's contact area. The ACP may be disposed at a proximal or a distal end of the dual-contact split probes as shown in FIG. 12. When positioned near a distal end adjacent to the probe continuity circuit, the ACP may provide a spring allowing probe members A1/A2 of probe A and/or B1/B2 of probe B (not shown) to move independently.

Figure 13:
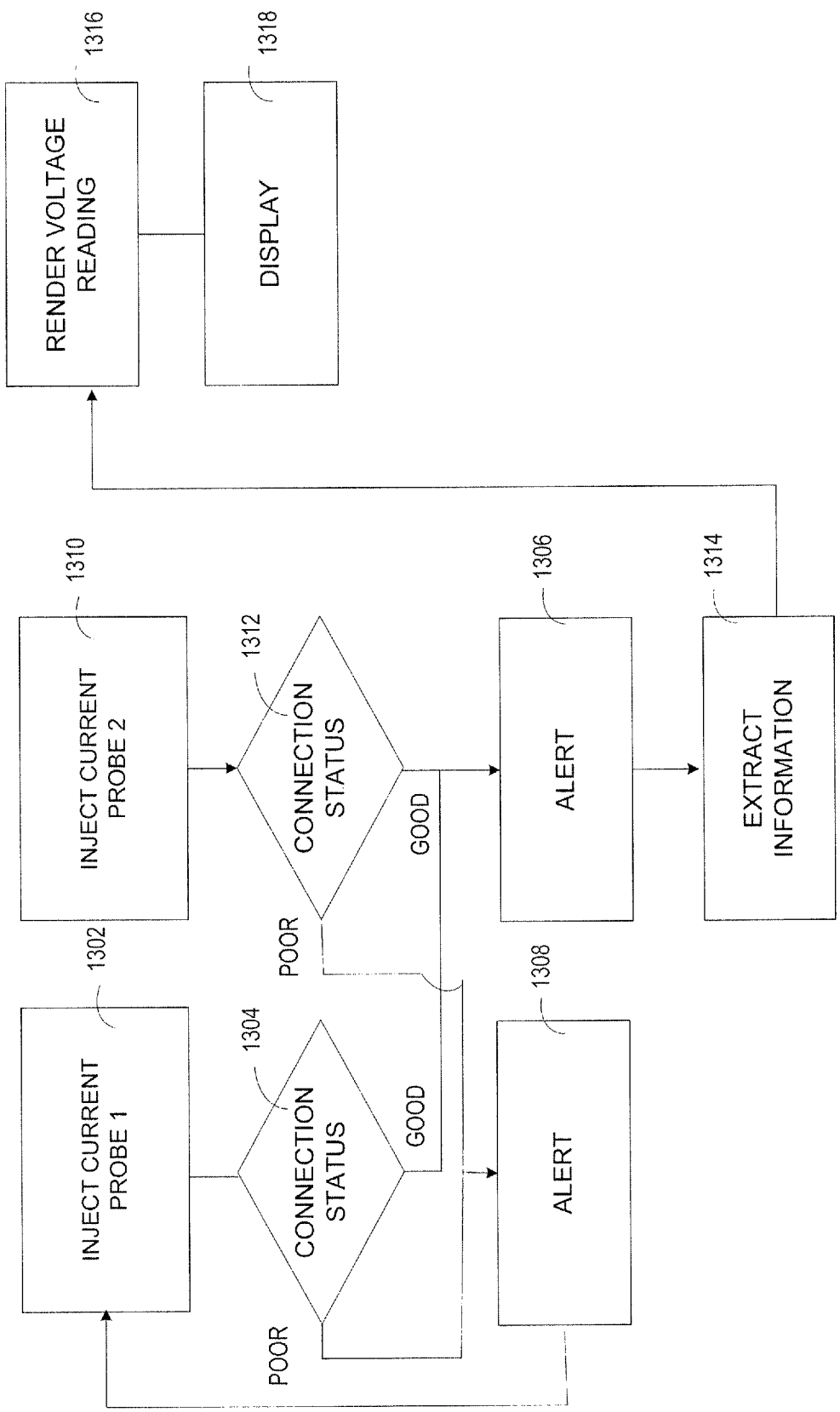
FIG. 13 is a process that assures electrical connections through a pair of dual-contact probes.

FIG. 13 is a process that assures electrical connections with a circuit under test. The process may use the systems shown and described in FIGS. 1-12. The process verifies when a probe is making contact with a circuit and provides first responders and electrical workers with a protocol to ensure their safe handling of electrical components. In FIG. 13, probe continuity circuit injects a programmable test current through a first contact area at 1302 when testing a first probe. The probe continuity circuit measures the current flowing through the first contact area and derives an impedance at 1304. When the impedance is below a predetermined value (e.g., <100Ω), continuity is established and the first probe's continuity circuit transmits a tactile, aural, and/or visual continuity confirmation alert (or alarm) at 1306. Similarly, when the impedance is equal to or greater than a predetermined value (e.g., =/>100Ω), the first's probe continuity circuit transmits a tactile, aural, and/or visual open circuit alert (or alarm) associated with a high resistant circuit at 1308 and the process may repeat. The continuity confirmation alert (or alarm) may take a similar or different sensory form than the open circuit alert (or alarm).

The process operates in a similar fashion when testing a second probe connection with a circuit by injecting a programmable test current. The probe's continuity circuit measures the current flowing through a second contact area and derives an impedance at 1312. When the impedance is below a predetermined value (e.g., <100Ω), continuity is established and the second probe's continuity circuit transmits a tactile, aural, and/or visual continuity confirmation alert (or alarm) at 1306. Similarly, when the impedance at the second area is equal to or greater than a predetermined value (e.g., =/>100Ω), the second probe's continuity circuit transmits a tactile, aural, and/or visual open circuit alert (or alarm) associated with an open circuit at 1308 and the process may repeat. The continuity confirmation alert (or alarm) may take a similar or different sensory form than the open circuit alert (or alarm).

With connections between probe 1 and probe 2 and the contact areas of the circuit under test are verified, the process extracts information required for a voltage measurement at 1314 and renders a voltage reading at 1316. The measurement result can be displayed in analog form using, for example, an electromechanical meter; or in digital form using, for example, a digital meter by sampling and converting the analog output signal into a digital format at 1318. The distinction between an analog and digital process is not due to the way in which the measurement result is displayed, but rather in the way in which the input signal is processed.

While each of the disclosed systems and processes may stand alone they also may be encompassed or retrofitted with other systems and applications. Other alternate systems may include any combinations of structure and functions described above or shown in one or more or each of the figures. These systems or methods are formed from any combination of structure and function described. The structures and functions may automatically test continuity when contact is made with a circuit under test, effectively; replacing switches 408A and 408B with pressure sensitive momentary micro switches that makes contact for a very brief or programmable controlled time when actuated, for example. A controller or preprogramming may manage the temporal duration of actuation or in other words, the duration in which continuity is measured.

Other systems include variations of continuity circuits that may identify DC bias or measure AC voltage and confirm good electrical connections (e.g., <100Ω) when measuring DC or AC voltage. Similarly, continuity may be iteratively measured automatically (e.g., 1302-1308 of FIG. 13) until good connections (e.g., <100Ω) are achieved without user interaction. Control may be managed by a controller within the probes or interfaced to the probes within the voltmeter or multi-meter.

All or parts of the voltmeter or controller may include one or more microprocessors (CPUs), one or more signal processors (SPU), one or more graphics processors (GPUs), one or more application specific integrated circuit (ASIC), one or more programmable media or any and all combinations of such hardware. All or part of the logic, specialized processes, and systems may be implemented as instructions for execution by multi-core processors (e.g., CPUs, SPUs, and/or GPUs), controller, or other processing device and stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the process descriptions or hardware descriptions above.

The term "coupled" disclosed in this description may encompass both direct and indirect coupling. Thus, first and second parts are said to be coupled together when they directly contact one another, as well as when the first part couples to an intermediate part which couples either directly or via one or more additional intermediate parts to the second part. The term "substantially" or "about" encompass a range that is largely (ninety five percent or more), but not necessarily wholly, that which is specified. It encompasses all but a significant amount. When devices are responsive to or occur in response to commands events, and/or requests, the actions and/or steps of the devices, such as the operations that devices are performing, necessarily occur as a direct or indirect result of the preceding commands, events, actions, and/or requests. In other words, the operations occur as a result of the preceding operations. A device that is responsive to another requires more than an action (i.e., the device's response to) merely follow another action.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A system that verifies continuity with a circuit and a plurality of test probes while measuring a potential difference across a plurality of voltmeter probes, a plurality of test probes, and a plurality of nodes comprising:
   a plurality of probe continuity circuits coupled to different nodes between a test probe and a voltmeter probe;
   a power source coupled to a momentary switch that injects a test current through current limiting resistors coupled to the plurality of nodes;
   wherein the plurality of probe continuity circuits that simultaneously measures continuity through current flowing through the plurality of nodes; by injecting a test current through each of the plurality of test probes and measuring the test current via the plurality of voltmeter probes in response to the injection received through each test probe; and
   wherein a voltmeter coupled to the plurality of probe continuity circuits for measuring the potential difference across the plurality of voltmeter probes during the injecting of the test current.

2. The system of 1 where the plurality of test probes comprises a plurality of probes that each have dual contacts.

3. The system claim 2 where continuity is derived by measuring the injected test current through the dual contacts.

4. The system of claim 2 where continuity is established when the resistance between the dual contacts is one-hundred ohms or less.

5. The system of claim 1 where the injected current comprises a programmable test current.

6. The system of claim 1 where continuity is measured individually as each test probe comes into electrical contact with the circuit.

7. The system of claim 1 where each of the plurality of test probes includes a tactile stimulator that generates a vibration perceptible to a human touch when continuity is established at each test probe.

8. The system of claim 1 where the voltmeter is configured to measure a potential difference while current is injected into the circuit.

9. A machine-readable medium encoded with machine-executable instructions for monitoring a plurality of nodes via a plurality of test probes, wherein execution of the machine-executable instructions is for:

Controlling a plurality of probes continuity circuits coupled to different nodes between a test probe and a voltmeter probe;

Injecting a test current through current limiting resistors coupled to the plurality of nodes sourced through a power source coupled to a momentary switch;

simultaneously measuring continuity through the plurality of probe continuity circuits and current flowing through the plurality of nodes by injecting a test current through each of the plurality of test probes and measuring the test current via a plurality of voltmeter probes in response to the injection received through each test probe; and measuring a potential difference across the plurality of voltmeter probes during the injecting of the test current.

10. The machine-readable medium of claim 9 where each one of the test probes in the plurality of test probes comprises a pair of dual contacts.

11. The machine-readable medium of claim 10 where continuity is derived by measuring the injected test current through the dual contacts.

12. The machine-readable medium of claim 10 where continuity is established when the resistance between the dual contacts is one-hundred ohms or less.

13. The machine-readable medium of claim 9 where the injected current comprises a programmable test current.

14. The machine-readable medium of claim 9 where continuity is measured individually as each test probe comes in contact with a circuit.

15. The machine-readable medium of claim 9 where each of the plurality of test probes includes or responds to machine-executable instructions that generates a vibration perceptible to a human touch as continuity is established at each test probe.

16. The machine-readable medium of claim 9 where the potential difference across the plurality of voltmeter probes is measured simultaneously as current is injected into a circuit.

* * * * *